US 12,394,635 B2

(12) United States Patent
Yang et al.

(10) Patent No.: US 12,394,635 B2
(45) Date of Patent: Aug. 19, 2025

(54) SYSTEMS AND METHODS FOR PROCESSING A SUBSTRATE

(71) Applicant: Taiwan Semiconductor Manufacturing Co., Ltd., Hsinchu (TW)

(72) Inventors: Sheng-chun Yang, Hsinchu (TW); Po-Chih Huang, Hsinchu (TW); Chih-Lung Cheng, Hsinchu (TW); Yi-Ming Lin, Hsinchu (TW); Chen-Hao Liao, Hsinchu (TW); Min-Cheng Chung, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 900 days.

(21) Appl. No.: 17/459,821

(22) Filed: Aug. 27, 2021

(65) Prior Publication Data

US 2023/0067115 A1    Mar. 2, 2023

(51) Int. Cl.
*H01L 21/324* (2006.01)
*H01L 21/67* (2006.01)

(52) U.S. Cl.
CPC ...... *H01L 21/324* (2013.01); *H01L 21/67017* (2013.01); *H01L 21/67115* (2013.01)

(58) Field of Classification Search
CPC ........ H01L 21/67393; H01L 21/67389; H01L 21/324; H01L 21/67017; H01L 21/67115; H01L 21/67248; H01L 21/67196
See application file for complete search history.

(56) References Cited

U.S. PATENT DOCUMENTS

| | | | | |
|---|---|---|---|---|
| 6,899,145 | B2* | 5/2005 | Aggarwal | H01L 21/67393 141/69 |
| 8,481,118 | B2* | 7/2013 | Burrows | C23C 16/45565 427/253 |
| 11,984,336 | B2* | 5/2024 | Woo | H01L 21/67386 |
| 2016/0118282 | A1* | 4/2016 | Maraschin | H01L 21/67769 206/711 |
| 2018/0358239 | A1* | 12/2018 | Senn | H01L 21/67778 |
| 2020/0073258 | A1* | 3/2020 | Chiu | G03F 7/70725 |
| 2020/0168493 | A1* | 5/2020 | Sunugatov | H01L 21/67259 |
| 2021/0343507 | A1* | 11/2021 | Yanai | H01J 37/321 |
| 2022/0359250 | A1* | 11/2022 | Woo | H01L 21/6732 |
| 2023/0067115 | A1* | 3/2023 | Yang | H01L 21/67248 |

FOREIGN PATENT DOCUMENTS

| | | |
|---|---|---|
| TW | 202107522 A | 2/2021 |
| WO | WO 2018087029 A1 | 5/2018 |

* cited by examiner

*Primary Examiner* — Mary A Wilczewski
(74) *Attorney, Agent, or Firm* — Seed Intellectual Property Law Group LLP

(57) ABSTRACT

A system and method for generating a gas curtain over an access port of a processing chamber for a semiconductor substrate. A gas flow stabilizer and a gas flow receiver, each including a horizontal flow section and a vertical flow section cooperate to generate a gas curtain that impedes gas, e.g., oxygen, from outside the processing chamber, from flowing into the chamber, for example, when the access port is opened to add/or to remove a workpiece from the processing chamber.

20 Claims, 8 Drawing Sheets

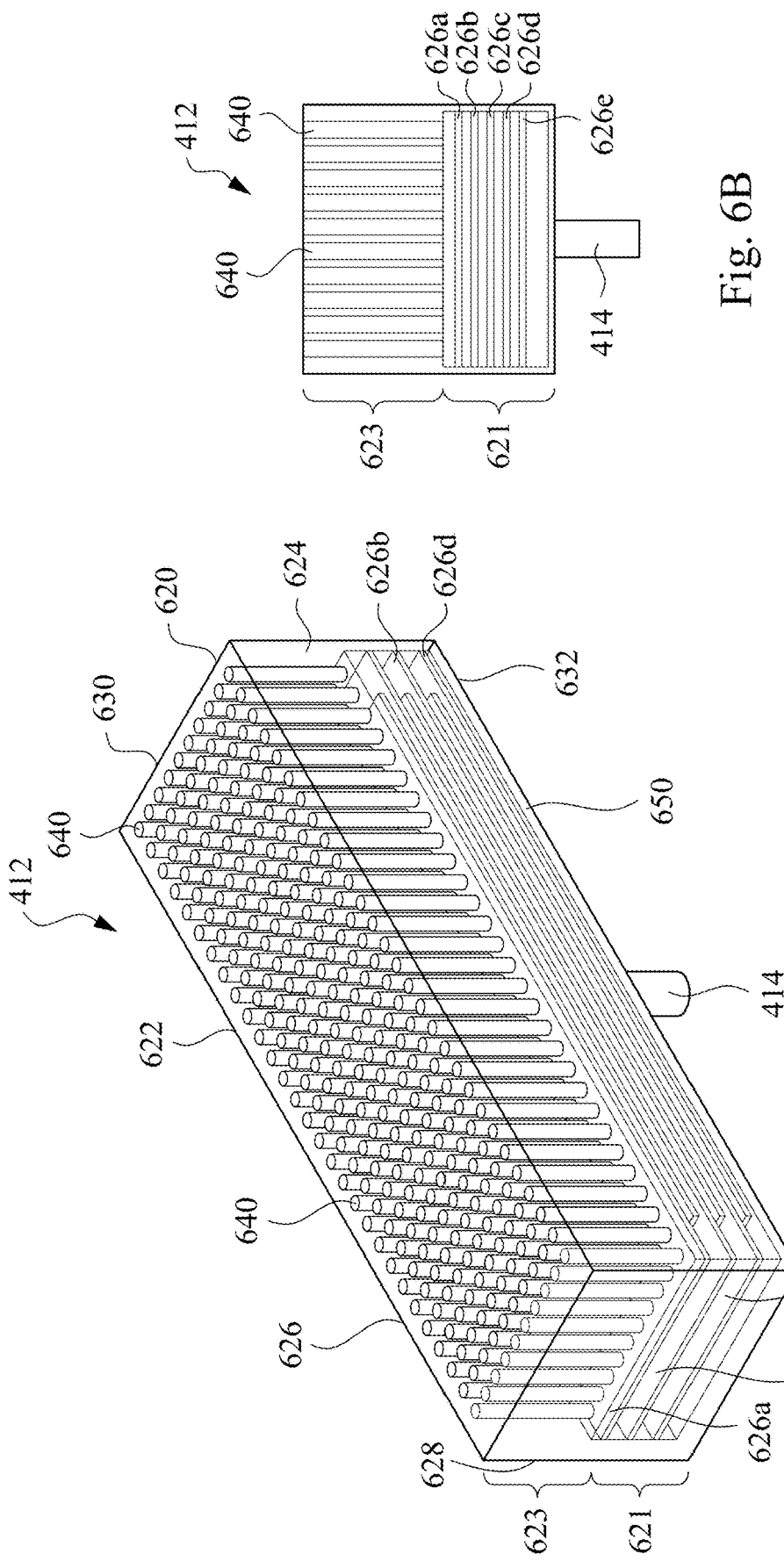

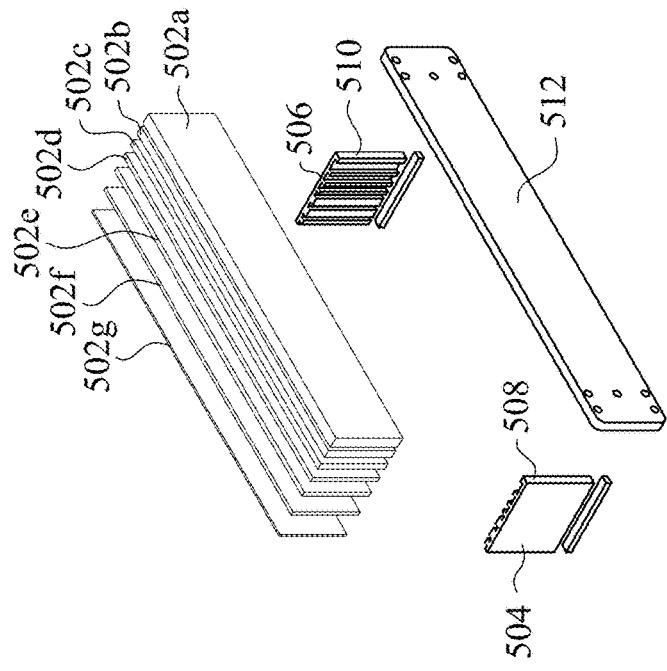
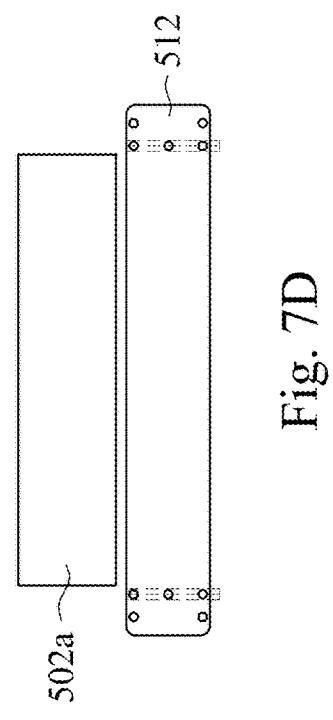
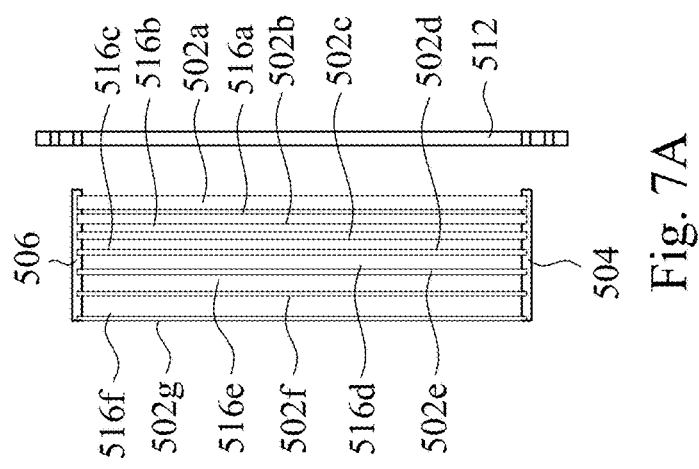
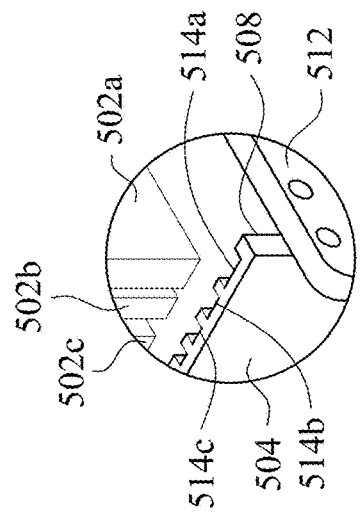

SYSTEMS AND METHODS FOR PROCESSING A SUBSTRATE

BACKGROUND

In the semiconductor industry, rapid thermal annealing (RTA) is a semiconductor process step used for the activation of dopants and the interfacial reaction of metal contacts. In principle, the operation involves rapid heating of a wafer from ambient to approximately 1000-1500 K. As soon as the wafer reaches the desired temperature, it may be held at such temperature before being quenched. Some implementations of RTA utilize an indirect infrared lamp to heat the wafer. The temperature of the wafer is determined with an indirect sensor, based on the radiation emitted by the wafer. After the RTA is completed the wafer is removed from the process chamber through an access port and prepared for further processing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A is a perspective view of a gas flow receiver in accordance with an embodiment of the present disclosure.

FIG. 6B is a cross-sectional view of the gas flow receiver of FIG. 6A.

FIG. 7A-7D are views from different perspectives of a gas flow stabilizer in accordance with an embodiment of the present disclosure.

DETAILED DESCRIPTION

Figure 1:
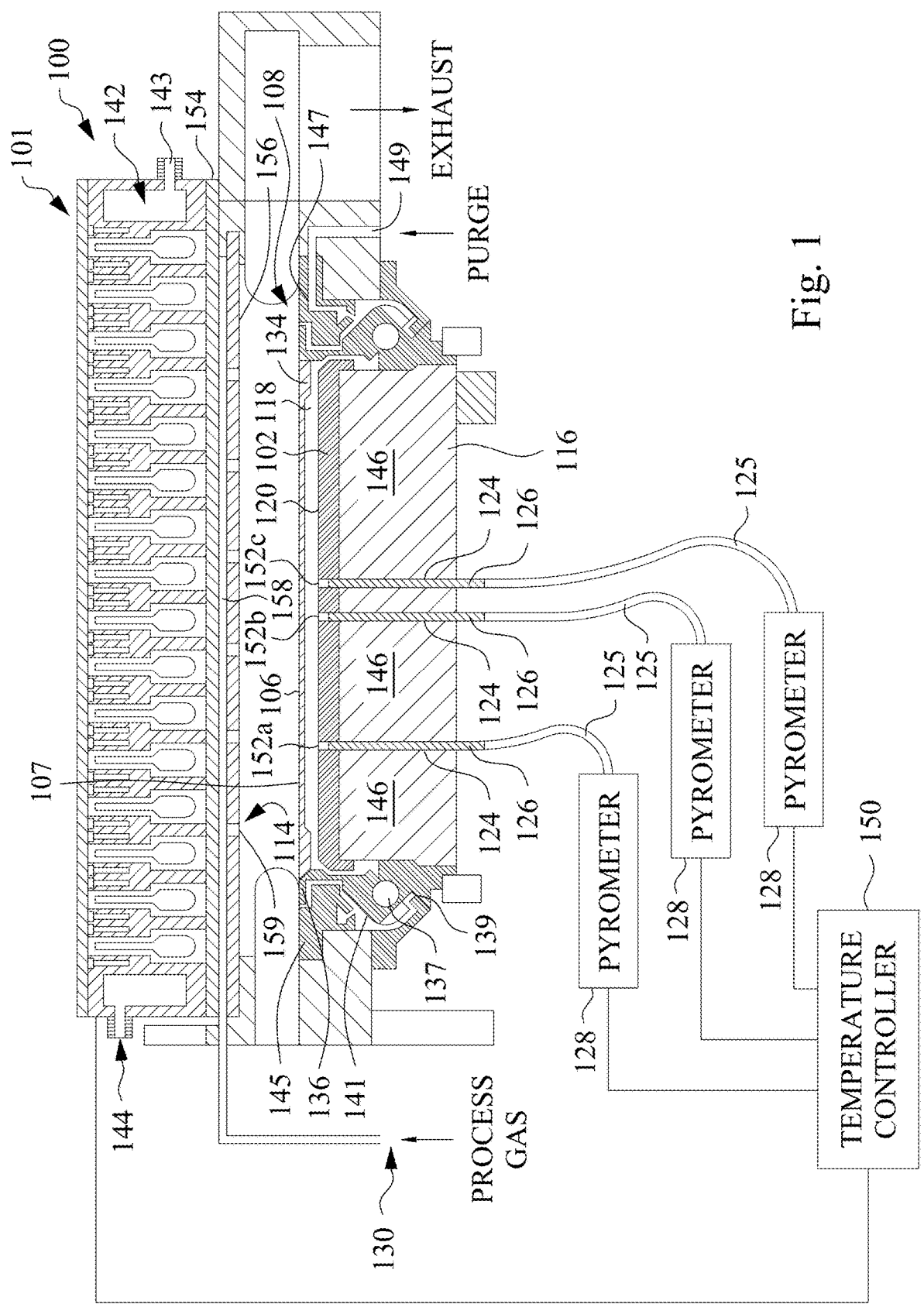
FIG. 1 is a schematic cross-sectional view of a rapid thermal processing (RTP) system for use with embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One embodiment described herein is a system for processing a substrate that includes a processing chamber including an access port. This embodiment includes a staging module for staging the substrate prior to delivering the substrate to the processing chamber through the access port and/or for receiving the substrate from the processing chamber through the access port. The system further includes an inert gas stabilizer positioned adjacent the access port. The inert gas flow stabilizer includes a horizontal flow guiding section and a vertical flow guiding section. In accordance with some embodiments, the system promotes a gas curtain outside the processing chamber and over the access port. The gas curtain serves to prevent or reduce the inflow of unwanted gases, e.g., oxygen, into the process chamber, especially when substrates are being introduced into or remove from the processing chamber. Preventing oxygen from entering process chambers is desirable because oxygen can damage sensors within the processing chamber and/or can interact with materials, e.g., aluminum, making up various components within the processing chamber and form unwanted films.

In other embodiments, a gas flow system is provided that includes a gas flow stabilizer and a gas flow receiver. The gas flow stabilizer and the gas flow receiver cooperate to promote the flow of a gas, e.g., an inert gas such as nitrogen, there between, thus forming a gas curtain of the type described in the previous paragraph. The gas flow stabilizer includes a horizontal flow guiding section through which gas flows and a vertical flow alignment section through which gas flows. The horizontal flow guiding section of the gas flow stabilizer overlies the vertical flow alignment section of the gas flow stabilizer. The horizontal flow guiding section of the gas flow stabilizer includes a plurality of overlapping horizontal gas flow paths and the vertical flow alignment section of the gas flow stabilizer includes a plurality of vertical gas flow pass. The gas flow receiver includes a vertical flow alignment section and a horizontal flow guiding section with the vertical flow alignment section of the gas flow receiver overlying the horizontal flow guiding section of the gas flow receiver. The vertical flow alignment section of the gas flow receiver includes a plurality of vertical gas flow paths in the horizontal flow guiding section of the gas flow receiver includes a plurality of overlapping horizontal gas flow paths.

Gas flow systems in accordance with some embodiments of the present disclosure are useful in methods for processing semiconductor substrates.

FIG. 1 illustrates a Rapid Thermal Processing system (RTP) in accordance with some embodiments of the present disclosure. The illustrated RTP system includes a processing chamber 100 having a lamp head 101 for processing a substrate 106. The lamp head 101 may include an array of lamps as depicted in FIG. 1.

The substrate 106 is mounted inside the chamber 100 on a substrate support 108 and is heated by the lamp head 101, which is disposed in a position opposing the substrate support 108. The lamp head 101 generates radiation which is directed to a front side 107 of the substrate 106. Alternatively (not shown), the lamp head 101 may be configured to heat the back side of the substrate 106, for example, such as by being disposed below the substrate 106, or by directing the radiation to the back side of the substrate 106. The radiation enters the processing chamber 100 through the window assembly 114. The window assembly 114 may be a water-cooled quartz window assembly 114. Beneath the substrate 106 is a reflector 102, which is mounted on a water-cooled, base 116. The base 116 may be a stainless steel base. The base 116 includes a circulation circuit 146 through which coolant circulates to cool the reflector 102. In some implementations, the reflector 102 is made of aluminum and has a highly reflective surface coating 120. Water is an example of a coolant that is circulated through the base 116 to keep the temperature of the reflector 102 below that of the heated substrate 106. Alternatively, other coolants may be provided at the same as the water coolant or at different temperatures that the water coolant. For example, antifreeze (e.g., ethylene glycol, propylene glycol, or the like) or other heat transfer fluids may be circulated through the base 116 and/or the base 116 may be coupled to a chiller (not shown). An underside or backside of the substrate 106 and the top of the reflector 102 form a reflecting cavity 118. The reflecting cavity 118 enhances the effective emissivity of the substrate 106.

The temperatures at localized regions of the substrate 106 are measured by a plurality of temperature sensors, such as 152a, 152b, and 152c. Each temperature sensor includes a light pipe 126 that passes through a conduit 124 that extends from the backside of the base 116 through the top of the reflector 102. The light pipe 126 may be a sapphire light pipe 126. The light pipe 126 is positioned within the conduit 124 so that its uppermost end is flush with or slightly below the upper surface of the reflector 102. The other end of light pipe 126 couples to a flexible optical fiber 125 that transmits sampled light from the reflecting cavity 118 to a pyrometer 128.

The pyrometer 128 is connected to a controller 150 which controls the power supplied to the lamp head 101 in response to a measured temperature. In some implementations, the lamp head 101 uses a plurality of lights to deliver highly collimated radiation from tungsten-halogen lamps to the processing chamber 100.

As indicated above, the described implementations use measurement or temperature sensors distributed over the reflector 102 so as to measure the temperature at different radii of the substrate 106. During the thermal processing, the substrate 106 is rotated. Thus, each sensor actually samples the temperature profile of a corresponding annular ring area on the substrate 106.

The concentration of various gases within the chamber 100 can be monitored by various sensors capable of detecting such gases. For example, the chamber may include an oxygen sensor or a nitrogen sensor or sensors capable of detecting other gases.

The substrate support 108 may be configured to be stationary or may rotate the substrate 106. The substrate support 108 includes a support or an edge ring 134 which contacts the substrate 106 around the substrate's outer perimeter, thereby leaving the entire underside of the substrate 106 exposed except for a small annular region about the outer perimeter.

The support ring 134 rests on a rotatable tubular quartz cylinder 136 that is coated with silicon to render it opaque in the frequency range of the pyrometer 128. The silicon coating on the quartz cylinder 136 acts as a baffle to block out radiation from the external sources that might contaminate the intensity measurements. The bottom of the quartz cylinder 136 is held by an annular upper bearing 141 which rests on a plurality of ball bearings 137 that are, in turn, held within a stationary, annular, lower bearing race 139. The annular upper bearing 141 is magnetically coupled to an actuator (not shown) which rotates the quartz cylinder 136, the edge ring 134 and the substrate 106 during the thermal processing.

A purge ring 145, which is fitted into the chamber body, surrounds the quartz cylinder 136. In some implementations, the purge ring 145 has an internal annular cavity 147 which opens up to a region above the annular upper bearing 141. The internal annular cavity 147 is connected to a gas supply (not shown) through a passageway 149. During processing, a purge gas is flowed into the chamber through the purge ring 145. Gases are exhausted through an exhaust port, which is coupled to a vacuum pump (not shown). These purge gases can be relied upon to maintain the pressure within the chamber above pressure outside the chamber and thereby reduce the likelihood that unwanted gases from outside the chamber will enter the chamber, e.g., when the substrate is introduced into the chamber or removed from the chamber; however, in some instances purge gases can carry unwanted particles into the chamber and/or cause the substrate to shift from a desired position within the chamber.

The window assembly 114 is disposed in an upper portion of the processing chamber 100 to allow light energy provided by the lamp head 101 to enter the processing chamber 100. In some implementations, the window assembly 114 includes an upper window 154 and a lower window 156. The upper window 154 and the lower window 156 each comprise a material, e.g., quartz, transparent to the energy provided by the lamp head 101 to allow radiation from the lamp head 101 to enter the processing chamber 100 there through.

During processing, a processing gas is introduced into the processing chamber 100 above the substrate 106 through the window assembly 114. The window assembly 114 may be used to more uniformly distribute the processing gas to the substrate 106 from overhead.

In some implementations, the lower window 156 is disposed below the upper window 154 and is spaced apart therefrom, to define a gap 158 there between. The gap 158 forms a plenum for receiving and flowing the processing gas therein from the inlet 130. The lower window 156 includes one or more outlets 159 for delivering a processing gas from the plenum (e.g., the gap 158) into the processing volume of the processing chamber 100.

In some embodiments, the lamp heads heat a buffer layer formed on the substrate 106 to a temperature sufficient to cause the buffer layer to relax. The temperature sufficient to cause the buffer layer to relax may be dependent upon factors including but not limited to the buffer materials and substrate materials used, the relative strain with respect to the substrate material and the duration of the process. The lamp head 101 may be adapted to heat the buffer layer formed on the substrate 106 to a temperature within a range of about 10 degrees Celsius to about 1800 degrees Celsius, such as about 400 degrees Celsius to about 600 degrees Celsius. The lamp head 101 may be coupled to a power distribution board (not shown) through which power is supplied to each lamp of the lamp head 101. The lamp head 101 may be cooled during or after processing by, for example, a cooling fluid. A cooling chamber 142 is defined by upper and lower chamber walls and a cylindrical wall. A coolant such as water may be introduced into the chamber via inlet 143 and removed via outlet 144.

Figure 2:
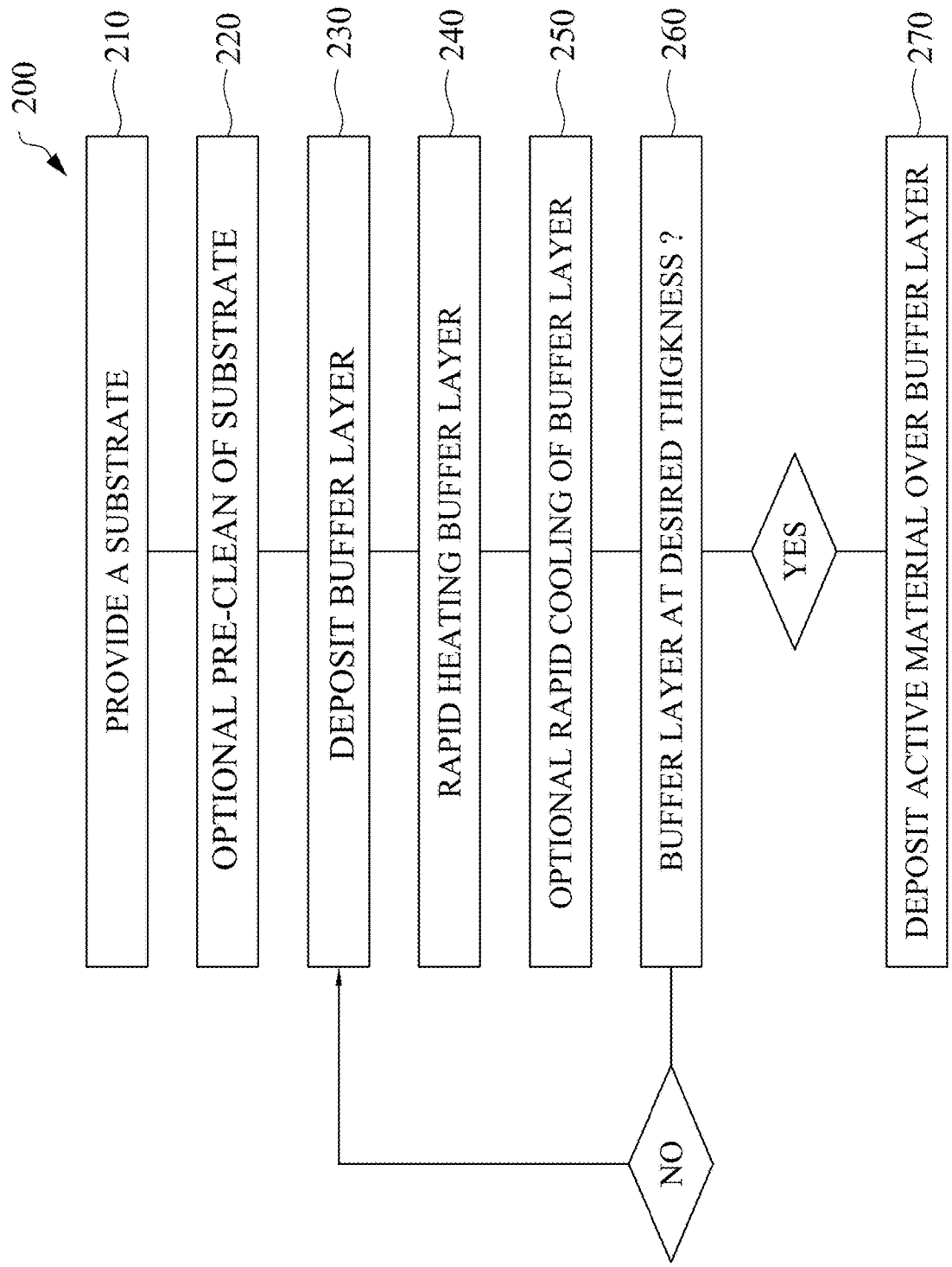
FIG. 2 is a plan view of a tool according to an embodiment in accordance with the present disclosure.

FIG. 2 is a flow diagram depicting a method 200 for forming a structure utilizing the chamber of FIG. 1 and the tool of FIG. 3 described below. Method 200 begins by providing a substrate to a reaction chamber at step 210. The substrate may be any substrate that an epitaxial layer can be formed on. These may include, for example, substrate wafers made from sapphire ($Al_2O_3$), silicon (Si) (doped and undoped), silicon carbide (SiC), spinel, zinc oxide, as well as compound semiconductor substrates such as gallium-arsenide (GaAs), lithium gallate, indium phosphide (InP), single-crystal GaN, aluminum nitride (AlN), $GdScO_3$ (GSO), $MoSe_2$, $Ge_2Sb_2Te_5$ (GST) and other chalcogenide materials, among other substrates.

At step 220, the substrate is pre-cleaned. The pre-clean process may be used to remove native oxides from the surface of the substrate. Prior to formation of the buffer layer, the substrate may be subjected to a pre-clean process and/or a degas process. In some implementations where processing of the substrate is performed ex-situ to the processing cluster tool, the substrate may be subjected to a pre-clean and/or degas process upon entering the cluster tool. The pre-clean process may be performed in a processing chamber positioned on a cluster tool, for example, cluster tool 300 (see FIG. 3).

At block 230 a buffer layer is deposited on the surface of the substrate. In some implementations, the buffer layer may be a single-layer, multi-layer or graded buffer layer. The buffer layer may comprise any material that helps accommodate the lattice mismatch between the substrate and materials to be deposited onto or formed on the substrate. The buffer layer may be deposited using any suitable deposition technique. Suitable deposition techniques include epitaxial deposition processes, metal organic chemical vapor deposition (MOCVD) processes, hydride vapor phase epitaxial (HYPE) processes, physical vapor deposition (PVD) processes, chemical vapor deposition (CVD) processes, atomic layer deposition (ALD) processes, Atomic Layer Epitaxy (ALE) and/or any other suitable process.

At step 240, the buffer layer is exposed to a rapid heating process. The rapid heating process may be an annealing process. The conditions of the annealing process are typically selected such that the buffer layer is heated to a temperature below the buffer layer's melting point but high enough to allow diffusion of dopants (when present) and rearrangement of lattice atoms to relax the buffer layer. Exemplary annealing processes include soak anneals, spike anneals, nanosecond anneals, millisecond anneals, laser annealing and combinations thereof.

The rapid heating process may be performed in the same chamber as the deposition process of block 230. For example, the rapid heating process and the deposition process may be performed in the same processing chamber. The rapid heating process may be performed in a separate chamber than the deposition process of step 230. In implementations where the rapid heating process is performed in a separate chamber, the separate chamber may be integrated on the same platform as the deposition chamber. In some implementations where the rapid heating process is performed in a separate chamber, the separate chamber may be positioned ex-situ from the integrated platform on which the deposition chamber is positioned. When the rapid heating process is carried out in a separate chamber, the substrate is removed from the chamber in which the deposition occurred and is transferred to a heating chamber.

The annealing process may be any high temperature thermal annealing process that is sufficient to cause the buffer layer to relax. The annealing process may be any high temperature thermal annealing process that is capable of heating the substrate to a temperature below the substrate's melting point but high enough to allow diffusion of dopants (when present) and rearrangement of lattice atoms. The temperature sufficient to cause the buffer layer to relax may be dependent upon factors including but not limited to the buffer materials and substrate materials used, the relative strain with respect to the substrate material, the type of anneal process used, the duration of the process, the temperature ramp-up rates and the temperature ramp-down rates. In some implementations, the annealing temperature is from about 200 degrees Celsius to about 2,000 degrees Celsius. In some implementations, the annealing temperature is about 900 degrees Celsius or above, for example, about 1,100 degrees Celsius to about 1,300 degrees Celsius. In some embodiments, depending on the buffer layer materials and the dopant, annealing temperatures within such ranges provide desired relaxation of the buffer layer and desired levels of diffusion of dopants into the substrate.

In some implementations the rapid heating process is a laser annealing process. The laser annealing process may be a pulsed laser annealing process. The pulsed laser annealing process as described herein may be performed by delivering electromagnetic radiation energy in a series of sequential pulses of energy to allow for diffusion and rearrangement of lattice atoms. The buffer layer may be exposed to multiple pulses of energy from a laser that emits radiation at one or more appropriate wavelengths for a desired period of time. The intensity and wavelength may be tuned depending on the amount of movement strain relaxation desired. Wavelengths of energy used may range generally from the microwave into the deep ultraviolet.

At step 250, the substrate is exposed to an optional rapid cooling process. The rapid cooling process of step 250 may occur in the same chamber as the rapid heating process of step 240. In other embodiments the cooling process is carried out in a chamber different from the chamber in which the heating process was conducted. In such embodiments, the substrate is removed from the chamber in which the heating process was conducted and is allowed to cool outside the chamber in which the heating process was conducted or is transferred to another chamber where it is allowed to cool. The rapid cooling process of step 240 may be an active cooling process or a passive cooling process. The rapid cooling process of step 250 may be performed by flowing a coolant through a portion of the chamber in which the cooling process is performed, for example, flowing a coolant through the substrate support on which the substrate is positioned in order to rapidly cool the substrate and/or using a coolant to cool the heating source used during the rapid heating process of step 240. In some implementations where rapid cooling and rapid heating are performed in the same chamber, the chamber may have a chamber liner configured to rapidly dissipate heat.

At step 260 when the buffer layer has achieved a desired thickness, the method 200 proceeds to step 270 where an active material layer is deposited over the buffer layer. If the buffer layer has not achieved the desired thickness, the method 200 proceeds back to step 230 where additional buffer layer material may be deposited on the previously deposited buffer layer material. The additional buffer layer material may be exposed to the rapid heating process of step 240 and the optional rapid cooling process of step 250.

While not discussed in detail here, at step 270, one or more device layers and/or active material layers may be formed over the buffer layer. The active material layer may include for example, a p-n junction which is necessary for the fabrication of the desired semiconductor device, such as light emitting diodes (LEDs), laser diodes (LDs), or other electronic applications such as transistors.

Figure 3:
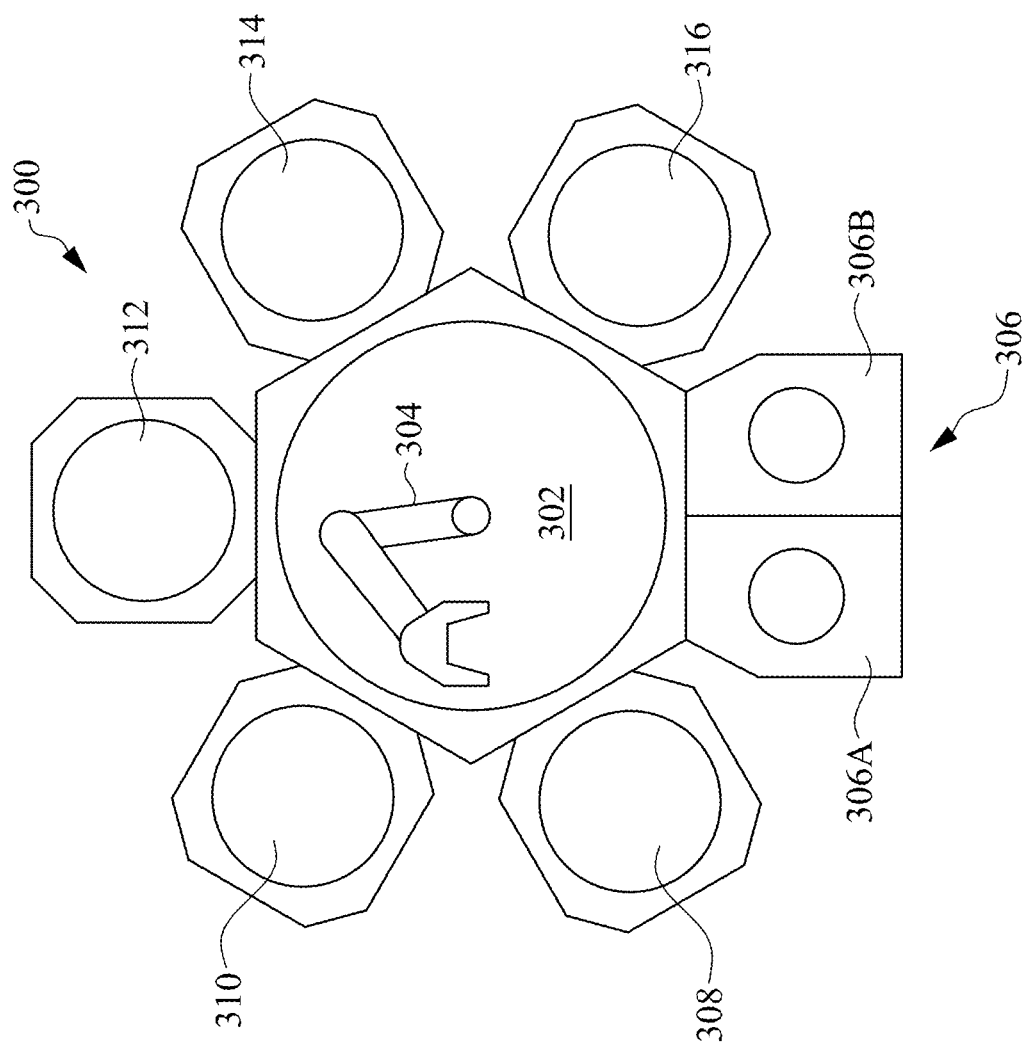
FIG. 3 is a flow diagram depicting a method for forming a structure using heteroepitaxial deposition according to one implementation described herein.

FIG. 3 is a plan view of an example of a cluster tool 300 in which the RTP described with reference to FIG. 1 may be included and which, in operation, carries out the process described above with reference to FIG. 2. In the embodiment of FIG. 3, a transfer robot 304 is disposed in a transfer chamber 302 or and equipment front end module of the cluster tool. A load-lock 306, with two load-lock chambers 306A, 306B are coupled to the transfer chamber 302. A plurality of processing chambers 308, 310, 312, 314, and 316 are also coupled to the transfer chamber 302. The plurality of processing chambers 308, 310, 312, 314, and 316 may include at least one of: a pre-clean chamber, a material deposition chamber such as an epitaxial deposition chamber, and a thermal processing chamber, such as an anneal, degas, or oxidation chamber.

Processing chamber 308 may be a pre-clean chamber configured to clean the substrate prior to deposition of a buffer layer and/or device layer. Processing chamber 310 and/or 314 may be a material deposition chamber such as an epitaxial deposition chamber capable of performing an epitaxial growth process. Processing chamber 312 and/or 316 may be a thermal treatment chamber capable of performing a thermal treatment process.

The cluster tool 300 may be used to perform the method 200 described above. During processing, a substrate that is to be processed may arrive to the cluster tool 300 in a pod (not shown). The substrate is transferred from the pod to the vacuum compatible load-lock chambers 306A, 306B by the factory interface robot (not shown). The substrate is then picked by the transfer robot 304 in the transfer chamber 302 which is generally kept in a vacuum state. The transfer robot 304 then loads the substrate into the processing chamber 308 for cleaning as described in block 220. The transfer robot 304 then picks up the substrate from the processing chamber 308 and loads the substrate into the processing chamber 310 or 314, whichever is available, for epitaxial deposition. An epitaxial buffer layer may be grown on the cleaned substrate in the processing chamber 310 or 314. The transfer robot 304 then picks up the substrate from the processing chamber 310 or 314 and transfers the substrate into the thermal processing chamber 312 or 316 whichever is available. The epitaxial buffer layer is then exposed to a rapid heating/cooling process as described in block 240 and block 250. The transfer robot 304 then picks the substrate from the thermal processing chamber 312 or 316 and transfers the substrate to processing chamber 314 for deposition of active material over the buffer layer as described in block 270.

An embodiment of the present disclosure, is described below with respect to a thermal processing chamber, such as thermal processing chambers 312 or 316 of FIG. 3; however, embodiments of the present disclosure are not limited to use with a thermal processing chamber. For example, embodiments of the present disclosure can be utilized in combination with other processing chambers that include load ports that open to atmospheric environments and receive therefrom substrates and open to atmospheric environments into which substrates from the processing chamber are delivered.

Figure 4:
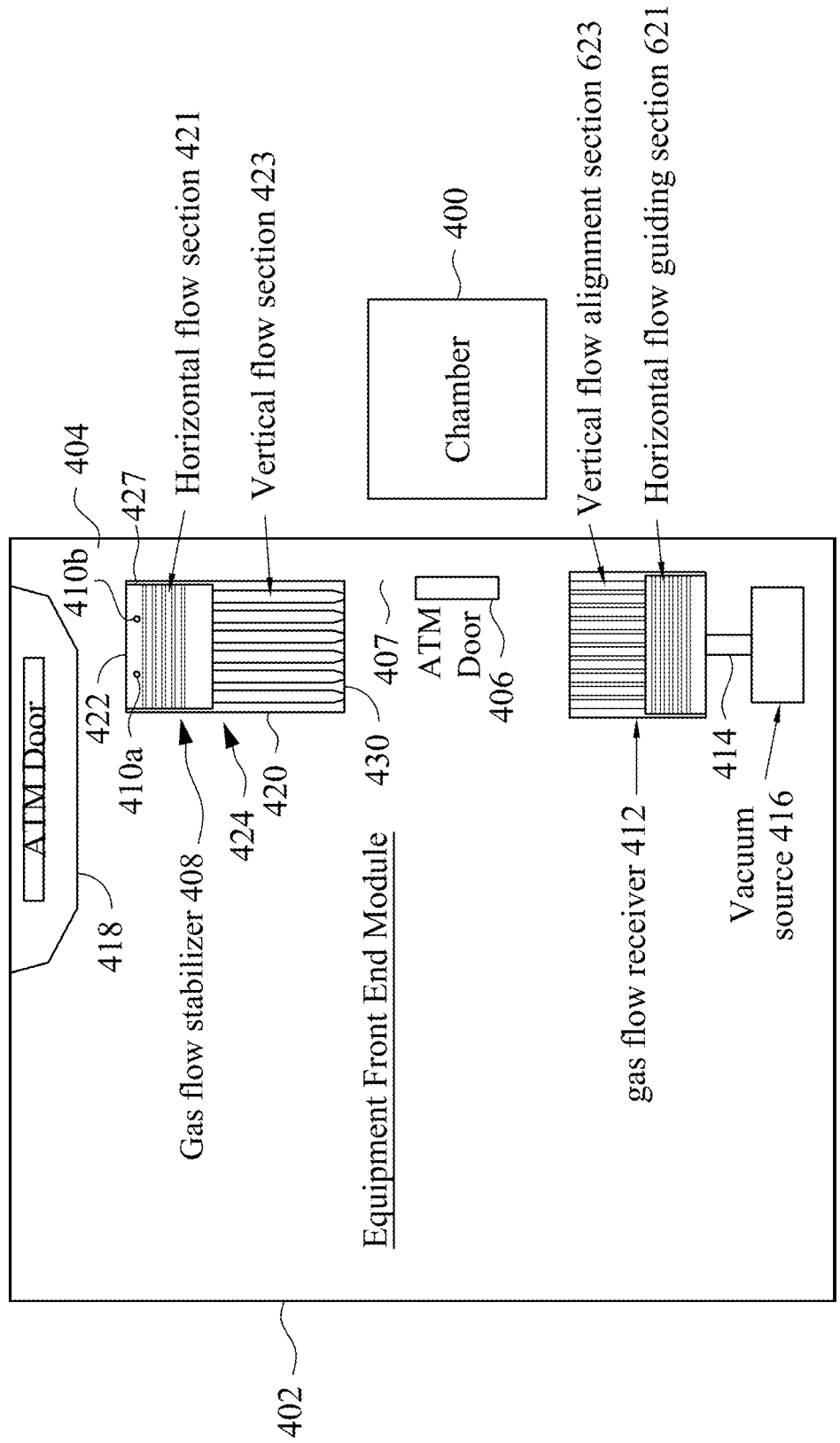
FIG. 4 is a schematic side view of a gas flow system in accordance with an embodiment of the present disclosure.

Referring to FIG. 4, a system for processing a substrate in accordance with an embodiment of the present disclosure includes a processing chamber 400 and a substrate staging module 402 (sometimes referred to as an equipment front end module (EFEM). The processing chamber 400 is separated from the substrate staging module 402 by a wall 404 of the substrate staging module 402. In some embodiments, the substrate staging module 402 is at atmospheric pressure. Access to the process chamber 400 is provided through an access port 406 in the wall 404. Substrates or workpieces in the substrate staging module 402 are transferred (e.g., by a robot not shown) through the access port 406 and received in the chamber 400 for processing. When processing in chamber 400 is completed, the substrate is removed from the chamber and passed through the access port 406 into the substrate staging module 402. In some embodiments of the present disclosure the processing chamber 400 is a chamber for carrying out a rapid thermal process as described above with reference to FIGS. 1-3. Embodiments in accordance with the present disclosure are not limited to a processing chamber 400 that carries out a rapid thermal process. Embodiments in accordance with the present disclosure include a processing chamber 400 capable of carrying out a process different from a rapid thermal process.

Continuing to refer to FIG. 4, rather than deliver a substrate from the substrate staging module 402 into a buffer zone before delivering the substrate to the processing chamber 400, in accordance with embodiments of the present disclosure, the substrate is delivered from the substrate staging module 402 into the processing chamber without passing through a buffer zone. A buffer zone can be utilized for a number of different reasons, including isolating the environment within the substrate staging module 402 from the environment within the processing chamber. By utilizing the buffer zone, gas within the substrate staging module 402 can be isolated from the processing chamber 400 and thereby prevented from entering the processing chamber 400. Preventing gas in a substrate staging module 402 from entering a processing chamber 400 can also be accomplished by maintaining the processing chamber 400 at a pressure that is greater than the pressure within the substrate staging module 402. Thus, when the access port 406 of the substrate staging module 402 is opened, gas from within the processing chamber 400 flows out of the chamber into the substrate staging module 402 while the pressure differential precludes gas in the substrate staging module 402 from flowing into the chamber 400. Such elevated pressure in the substrate staging module 402 can be achieved by supplying a purge gas into the process chamber 400. Drawbacks of utilizing a purge gas in this manner include carrying particles into the process chamber 400, causing particles in the process chamber to become mobile, causing the workpiece to shift or causing damage to gas sensors within the chamber.

Still referring to FIG. 4, a substrate staging module 402 in accordance with an embodiment of a system for processing a substrate in accordance with the present disclosure includes, a gas flow stabilizer 408 located above the access port 406 on an inner surface 407 of wall 404 of substrate staging module 402. Gas flow stabilizer 408 includes two gas inlets 410a and 410b that are in fluid communication with a source of gas, e.g., an inert gas such as nitrogen. Further details of gas flow stabilizer 408 are described below with reference to FIGS. 5 and 7A-7D. Substrate staging module 402 further includes a gas flow receiver 412 located below the access port 406 on the same inner surface 407 of wall 404 upon which gas flow stabilizer 408 is located. Gas flow receiver 412 includes an outlet 414 in fluid communication with a source of vacuum 416. Further details of gas flow receiver 412 are described below with reference to FIGS. 6A and 6B. In the embodiment illustrated in FIG. 4, substrate staging module 402 includes a second access port 418. Second access port 418 is a loading port and is configured to cooperate with a FOUP which supplies substrates or workpieces to the substrate staging module 402. In operation, the system for processing a substrate illustrated in FIG. 4, receives substrates from a FOUP through access port 418. The substrates received into substrate staging module 402 are delivered through access port 406 into chamber 400. In accordance with some embodiments of the present disclosure, gas is delivered to gas flow stabilizer 408 via gas inlets 410*a* and 410*b*. Such gas exits from a bottom of gas flow stabilizer 408 and flows downward along wall 404 towards gas flow receiver 412. Gas that exits gas flow stabilizer 408 is drawn towards gas flow receiver 412, due to the reduced pressure at the top of gas flow receiver created by the gas flow receiver being in fluid communication with vacuum source 416. Substrate staging module 402 can further include other components (not shown) such as a wafer transfer robot, cooling station and clean gas delivery system, e.g., a gas filter fan unit.

In some embodiments of the present disclosure, the flow of gas between gas flow stabilizer 408 and gas flow receiver 412 along inner surface 407 of wall 404 is laminar, in which the gas travels smoothly and/or in regular paths, in contrast to turbulent flow, in which the fluid undergoes irregular fluctuations in mixing. In laminar flow, sometimes referred to as streamlined flow, the velocity, pressure and other flow properties at each point in the fluid remain constant. Laminar flow can be characterized by fluid particles following in smooth paths in layers, with each layer moving smoothly past the adjacent layers with little or no mixing. At low velocities, the fluid tends to flow without lateral mixing, and adjacent layers slide past one another. There are no cross-currents perpendicular to the direction of flow, nor eddies or swirls of fluids. In laminar flow, the motion of the particles of the fluid is very orderly with particles close to a solid surface moving in straight lines parallel to that surface. The dimensionless Reynolds number is a parameter that describes whether fully developed flow conditions lead to laminar or turbulent flow. The Reynolds number is the ratio of the inertial to the shearing of the fluid, i.e., how fast the fluid is moving relative to how viscous the fluid is, irrespective of the scale of the fluid system. Laminar flow generally occurs when the fluid is moving slowly or the fluid is very viscous. As the Reynolds number increases, such as by increasing the flow rate of the fluid, the flow will transition from laminar to turbulent flow at a specific range of Reynolds numbers. In accordance with embodiments of the present disclosure, when the gas flowing between the gas flow stabilizer and the gas flow receiver is nitrogen, in accordance with embodiments of the present disclosure, the Reynolds number is at or below a value that indicates the nitrogen gas flow between gas flow stabilizer 408 and gas flow receiver 412 is laminar. For example, in some embodiments of the present disclosure, the Reynolds number for a flow of nitrogen gas between gas flow stabilizer 408 and gas flow receiver 412 is in the range of less than 2000, e.g., 1000 to 160. Within such range of Reynolds numbers, the flow of nitrogen gas will provide a desired gas curtain in accordance with the present disclosure. Embodiments in accordance with the present disclosure are not limited to this range of Reynolds numbers. For example, in other embodiments of the present disclosure, the Reynolds number is less than about 3000. In other embodiments the Reynolds number can be above the range recited in the previous sentence or below the range recited in the previous sentence. In addition, if the gas is a gas other than nitrogen, the Reynolds number is a value that is below the Reynolds number associated with a transition from laminar flow to turbulent flow.

Figure 5:
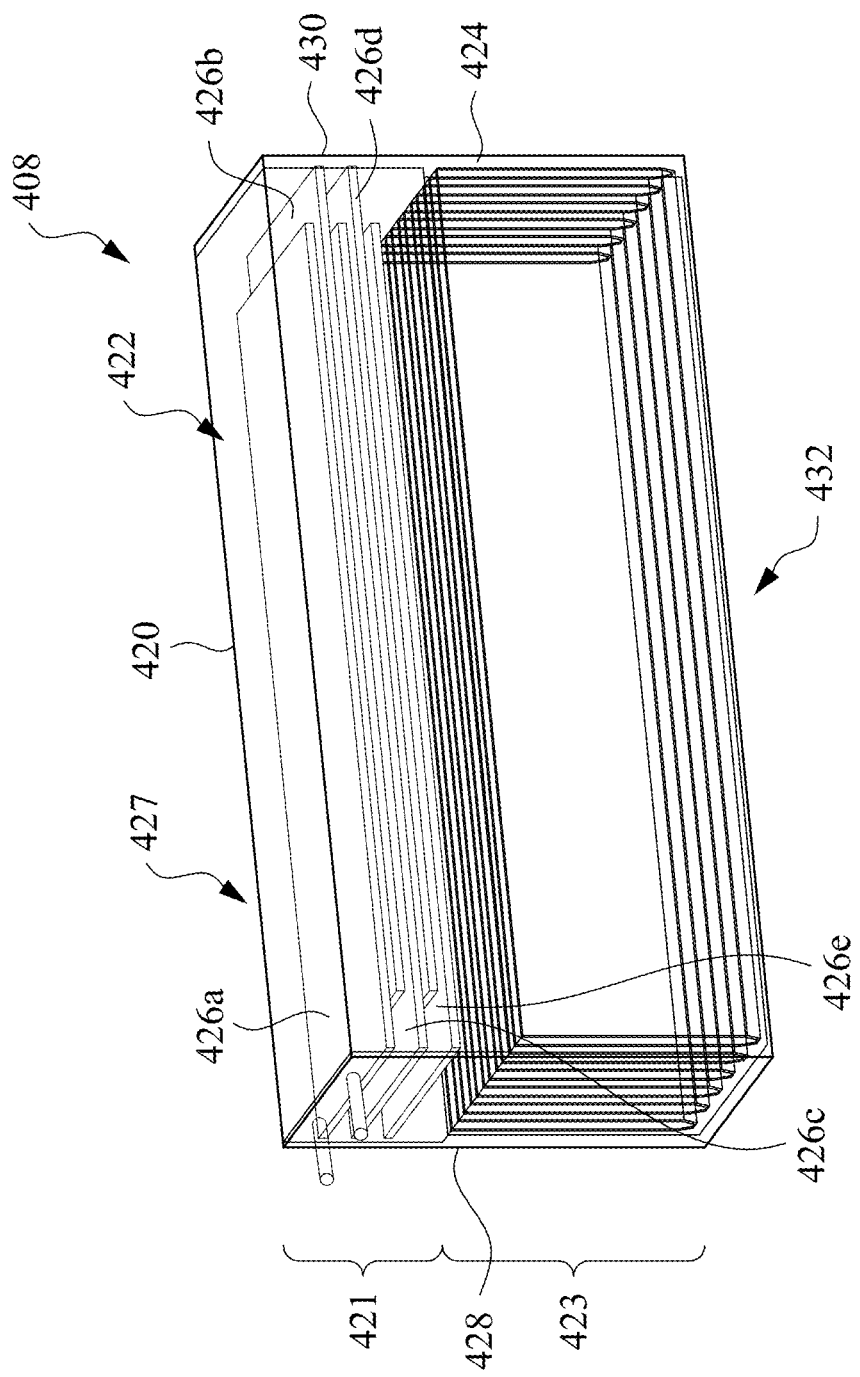
FIG. 5 is a perspective view of a gas flow stabilizer in accordance with an embodiment of the present disclosure.

Referring to FIGS. 4 and 5, gas stabilizer 408 includes housing 420 that includes a top side 422, front side 424, back side 427, left end 428 and right end 430. The bottom side 432 of housing 420 is open, i.e., not closed in. Housing 420 is made of any suitable rigid material such as metal or plastic that is inert to any gas that housing 420 might come in contact with. Gas stabilizer 408 includes a horizontal flow section 421 comprising an upper section of housing 420 overlying a vertical flow section 423 comprising a lower section of housing 420. Horizontal flow section 421 includes a gas flow path designed to promote a uniform gas pressure (e.g., a gas pressure free of pressure pulses that would otherwise negatively affect the ability of vertical flow section 423 to provide a laminar flow of gas along inner surface 407 of wall 404). Horizontal flow section 421 includes a plurality of horizontal plates 426*a*-426*e* made from any rigid material such as metal or plastic. Horizontal plates 426*a*-426*e* have a width that is substantially the same as the width of the interior of housing 420, such that long edges of horizontal plates 426*a*-426*e* abut the inside surface of housing 420 along the front side 424 and backside 427 of housing 420. The long edges of horizontal plates 426*a*-426*e* are sealed to the inside surface of housing 420 such that gas flowing through the horizontal flow section 421 cannot flow between the long edges of horizontal plates 426*a*-426*e* where they are abutted or sealed to inner surface of housing 420. In the illustrated embodiment, the length of horizontal plates 426*a*-426*e* is less than the length of the interior of housing 420. In the illustrated embodiment, the left hand ends of horizontal plates 426*a*, 426*c* and 426*e* are abutted with and sealed to the left-hand end of the interior of housing 420. The right hand end of horizontal plates 626*a*, 626*c*, and 626*e* are abutted with and sealed to the right hand end of the interior of housing 420. In this manner, horizontal plates 426*a*-426*e* define a serpentine path through which gas flows from the top of the horizontal flow section 421 to the bottom of the horizontal flow section 421. In the embodiment illustrated in FIG. 5, gas that enters gas inlets 410*a* and 410*b* flows to the right above horizontal plate 426*a*. When the gas reaches the right hand end of horizontal plate 426*a*, it changes direction by 180 degrees and flows to the left between horizontal plate 426*a* and horizontal plate 426*b*. When the gas reaches the left-hand end of horizontal plate 426*b*, it changes direction by 180 degrees and flows to the right between horizontal plate 426*b* and horizontal plate 426*c*. The gas continues this serpentine path until it reaches the right hand end of horizontal plate 426*e*, where the gas flows downward into the top of vertical flow section 423.

Referring to FIGS. 5 and 7A-7D, vertical flow section 423, in accordance with an embodiment of the present disclosure is defined by a lower portion of housing 420 in which a plurality of vertical plates 502*a*-502*g* are arranged and supported. Vertical plates 502*a*-502*g* are made from any rigid material, such as metal or plastic. Horizontal plates 426*a*-426*e* have a length (L) that is substantially equal to the length of the inner surface of housing 420. The height (H) of vertical plates 502*a*-502*g* is sufficient such that vertical plates 502*a*-502*g* occupy a portion of the housing below the horizontal plates 426*a*-426*e* of the horizontal flow section 421. In accordance with embodiments of the present disclosure, the vertical plates 502*a*-502*g* can have a height or length different from that depicted in FIGS. 5 and 7A-7D. In other words, the vertical plates 502a-502g can be taller or shorter than depicted in FIGS. 5 and 7A-7D. Also, vertical plates 502a-502g can be shorter than depicted in FIGS. 5 and 7A-7D. Referring to FIGS. 7A-7D, in the illustrated embodiment, the left-hand end of vertical plates 502a-502g are received and held in place by a plurality of grooves 514 in a retainer 504. The right hand end of vertical plates 502a-502g are received and held in place by a plurality of grooves provided in retainer 506. Referring to FIG. 7A-7D, front edge 508 of retainer 504 and front edge 510 of retainer 506 are secured to mounting plate 512 by fasteners (not shown). In the embodiment of FIG. 4, mounting plate 512 is secured to inner wall 404 of substrate staging module 402. When the vertical flow section 423 of gas flow stabilizer 408 is formed in accordance with FIGS. 7A-7D, the vertical plate 502g can form the back side 427 of housing 420. In such a configuration, the lower edge of the backside of housing 420 forming the backside of horizontal flow section 421 is connected to the upper edge of vertical plate 502g.

Referring to FIGS. 7A-7D, the width of vertical plates 502a-502g decreases as the plates move further away from mounting plate 512. This results in the width (W) of the gap or space between adjacent plates increasing moving away from mounting plate 512. More specifically, gap 516a is wider than gap 516b which is wider than gap 516c which is wider than gap 516d which is wider than gap 516e which is wider than gap 516f. The minimum width of gaps 516a-516f can vary. In some embodiments, the minimum width of gaps 516a-516f is at least 2 mm; however, in other embodiments, the minimum width can be less than 2 mm. The amount that the gap spacing increases moving away from the mounting plate 512 can vary. In some embodiments, adjacent gaps vary in width by about 2 mm or more. In other embodiments the adjacent gaps vary in width by an amount that is less than 2 mm. Providing a gas flow stabilizer 408 including gaps of the foregoing widths contributes to the ability of the gas flow stabilizer 408 to create a gas flow exiting gas flow stabilizer 408 that supports a laminar gas flow between gas flow stabilizer 408 and gas flow receiver 412. In accordance with some embodiments of the present disclosure, the ratio of the width of the gaps 516a-516f (W) to the length (L) of vertical plates 502a-502g ranges between about 0.02 to 0.05. In accordance with some embodiments of the present disclosure, the ratio of the width of the gaps 516a-516f (W) to the width of the vertical flow section 423 (measured from the exterior of plate 502g and the exterior of plate 502a ranges from about 0.04 to 0.1. When gas flow stabilizer 408 includes gaps 516 that satisfy these width to length ratios, gas flow stabilizer is able to create a gas flow exiting gas flow stabilizer that supports a laminar gas flow between gas flow stabilizer 408 and gas flow receiver 412.

Referring to FIG. 7C, retainer 504 includes grooves 514a-514c. In the illustrated embodiment, the width of grooves and 514a is greater than the width of groove 514b which is greater in width than groove 514c. The width of these grooves corresponds to the width of the respective vertical plates 502a-502g that will be received in the respective grooves.

In operation, gas that flows out of the bottom of horizontal flow section 421 enters the top of vertical flow section 423 and is dispersed across the top of the gaps 516a-516f and enters respective gaps and begins to flow in a vertical direction. The gas leaves the vertical flow section 423 at the bottom of housing 420. This gas is drawn towards gas flow receiver 412 due to the suction produced by the vacuum connected to gas flow receiver 412. As noted above, in some embodiments, the gas flow between gas flow stabilizer 408 and gas flow receiver 412 is laminar across the inner surface 407 of wall 404. This laminar flow of gas across access port 406 creates a barrier to gas from within substrate staging module 402 entering chamber 400 when access port 406 is open.

Referring to FIG. 6A, an embodiment of a gas flow receiver 412 in accordance with the present disclosure is illustrated. Gas flow receiver 412 includes housing 620 that includes a bottom side 632, front side 624, back side 626, left end 628 and right end 630. The top side 622 of housing 620 is open. Housing is made of any suitable rigid material such as metal or plastic. Gas flow receiver 412 includes a horizontal flow section 621 within housing 620. Horizontal flow section 621 is below vertical flow section 623 which is also within housing 620. Horizontal flow section 621 includes a gas flow path which creates a uniform gas pressure e.g., a gas pressure free of pressure pulses that would otherwise negatively affect the ability of vertical flow section 623 to promote a laminar flow of gas along inner surface 407 of wall 404. Horizontal flow section 621 includes a plurality of horizontal plates 626a-626e made from any rigid material such as metal or plastic. In the embodiment illustrated in FIGS. 6A and 6B, horizontal plates 626a-626e are supported within a horizontal flow chamber 650 that is contained within housing 620. In the illustrated embodiment, horizontal flow chamber 650 is a rectangular box having a width and length slightly less than the width and length of the interior surface of housing 620 such that horizontal flow chamber 650 fits within housing 620. A top surface of horizontal flow chamber 650 includes a plurality of orifices for receiving the bottom of vertical flow conduits (640 described below). The bottom surface of horizontal flow chamber 650 includes an orifice that is in fluid communication with outlet 414 which is in fluid communication with vacuum source 416. Horizontal plates 626a-626e have a width that is substantially the same as the width of the interior of horizontal flow chamber 650, such that the long edges of horizontal plates 626a-626e abut the inside surface of horizontal flow chamber 650 along the front side and backside of horizontal flow chamber 650. Gas within horizontal flow chamber 650 cannot flow between the long edges of horizontal plates 626a-626e and the interior surface of horizontal flow chamber 650 where horizontal plates 626a-626e are abutted or sealed to inner surface of horizontal flow chamber 650. The length of horizontal plates 626a-626e is less than the length of the interior horizontal flow chamber 650. In the illustrated embodiment, the left hand ends of horizontal plates 626a, 626c, and 626e are sealed to the left-hand end of horizontal flow chamber 650. The right hand end of horizontal plates 426b and 426d are sealed to the right hand end of horizontal flow chamber 650. In this manner, horizontal plates 626a-626e define a serpentine gas flow path within the horizontal flow section 621 of gas flow receiver 412. In the embodiment illustrated in FIG. 6A, gas that enters horizontal flow section 621 from vertical flow section 623 flows to the right above horizontal plate 626a. When the gas reaches the right hand end of horizontal plate 626a, it changes direction by 180° and flows to the left between horizontal plate 626a and horizontal plate 626b. When the gas reaches the left-hand end of horizontal plate 626b, it changes direction by 180° and flows to the right between horizontal plate 626b and horizontal plate 626c. The gas continues this serpentine path until it reaches the right hand end of horizontal plate 626e, where the gas flows downward below plate 626e and is removed from horizontal flow chamber 650 via outlet 414.

Continuing to refer to FIGS. 6A and 6B, vertical flow section 623 in accordance with an embodiment of the present disclosure is defined in an upper portion of housing 620. Vertical flow section 623 includes a plurality of vertically oriented conduits 640 having a round cross-section. As noted above, the bottoms or vertically oriented conduits 640 are received into the top of horizontal gas flow chamber 650. The vertical conduits 640 are made from any rigid material, such as metal or plastic. In the embodiment illustrated in FIGS. 6A and 6B, vertical conduits 640 are arranged in 10 rows, each row including 29 vertical conduits, with the position of the vertical conduits of adjacent rows being offset in a direction along the length of the housing 620. The length of the vertical conduits is approximately equal to the distance between upper surface of horizontal flow chamber 650 and the top of housing 620. In accordance with other embodiments, the length of vertical conduits 640 is less than the distance between upper surface of horizontal flow chamber 650 and the top of housing 620. The diameter of the vertically oriented conduits 640 can vary. In some embodiments, the diameter of vertically oriented conduits 640 is about 2 mm. In other embodiments, the diameter of vertically oriented conduits 640 is greater than 2.2 mm and in other embodiments, the diameter of vertically oriented conduits 640 is less than 1.8 mm. Vertically oriented conduits having inner diameters that fall within the ranges described above are able to provide sufficient open cross-sectional area to allow gas flow receiver 412 to draw a sufficient amount of gas from gas flow stabilizer 408 into gas flow receiver 412 to support the formation of a gas curtain, which in some embodiments is a laminar gas flow. In the illustrated embodiment, vertical flow section 623 includes about 290 vertical conduits. In other embodiments in accordance with the present disclosure, vertical flow section 623 includes more than 290 vertical conduits. In other embodiments in accordance with the present disclosure, vertical flow section 623 includes less than 290 vertical conduits. The ratio of the combined surface area of the openings of the vertical conduits 640 to the surface area of the top of housing 620 ranges between about 0.5 to about 0.9. A ratio of the combined surface area of the openings of the vertical conduits to the surface area of the top of housing 620 within the foregoing ranges provides sufficient open cross-sectional area to allow gas flow receiver 412 to draw a sufficient amount of gas from gas stabilizer 408 into gas flow receiver 412 to support the formation of a gas curtain, which in some embodiments is a laminar gas flow. The pattern of the spacing between vertical conduits 640 and the distance between adjacent vertical conduits 640 is chosen depending on the gas flow rate that is desired to support a laminar flow between gas flow stabilizer 408 and gas flow receiver 412. For example, vertical conduits spaced more closely together can support a larger gas flow compared to vertical conduits that are not spaced as closely together. Embodiments in accordance with the present disclosure are not limited to the foregoing ratio of combined surface area of the openings of the vertical conduits 642 the surface area of the top of housing 620. For example in other embodiments, the ratio of combined surface area of the openings of the vertical conduits 642 the surface area of the top of housing 620 can be above or below the range of ratios recited above.

In accordance with embodiments of the present disclosure, in other embodiments in accordance with the present disclosure, instead of vertical conduits 640, gas flow receiver 412 includes vertical plates similar to the vertical plates described above with reference to FIGS. 5 and 7A-7D. In accordance with embodiments of the present disclosure, the vertical plates utilized in gas flow receiver 412 can have different thicknesses so as to provide gas flow paths of different widths or the vertical plates may have equal widths and provide gas flow paths that are of equal widths.

In accordance with some embodiments of the present disclosure, the gas flow stabilizer 408 includes the vertical flow section 423 and not the horizontal flow section 421. Similarly, gas flow receiver 412 includes the vertical flow section 623 and not the horizontal flow section 621.

Figure 8:
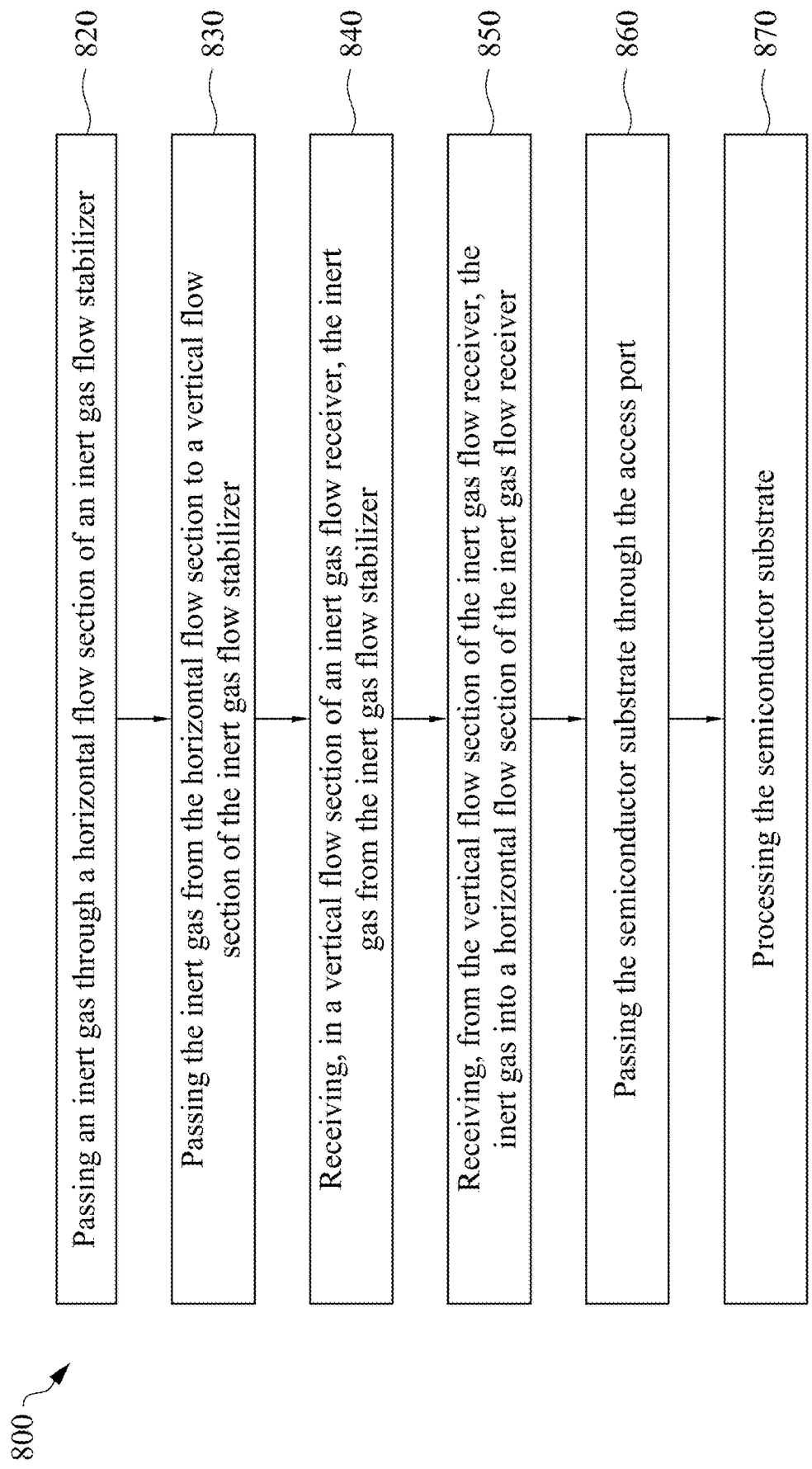
FIG. 8 is a flow chart of an embodiment of a method in accordance with the present disclosure.

Referring to FIG. 8, a method 800 in accordance with an embodiment of the present disclosure includes step 820 of passing an inert gas through a horizontal flow section of an inert gas flow stabilizer that is located above and access port to a processing chamber. Step 830 of the method 800 includes passing the inert gas from the horizontal gas flow section to a vertical flow section of the inert gas flow stabilizer, wherein the horizontal flow section of the inert gas flow stabilizer overlies the vertical flow section of the inert gas flow stabilizer. Step 840 of the method includes receiving, in a vertical flow section of the inert gas flow receiver, the inert gas from the inert gas flow stabilizer. Step 850 involves receiving, from the vertical flow section of the inert gas flow receiver, the inert gas into a horizontal flow section of the inert gas flow receiver. The vertical flow section of the inert gas flow receiver overlying the horizontal flow section of the inert gas flow receiver. At step 860, the semiconductor substrate is passed through the access port. At step 870, the semiconductor substrate is processed in the processing chamber.

In accordance with one embodiment, a system for processing a substrate or work piece is described. The system includes a processing chamber and a staging module for staging the substrate prior to delivering the substrate to the processing chamber. The system further includes an access port between the processing chamber and the staging module through which the substrate is passed between the staging module and the processing chamber. A gas flow stabilizer is positioned adjacent the access port. The gas flow stabilizer includes a horizontal flow section and a vertical flow section. In some embodiments, gas flowing out of the gas flow stabilizer flows in a laminar state across the access port.

In another embodiment of the present disclosure, a method of processing a semiconductor substrate includes receiving a semiconductor substrate into a processing chamber via an access port and processing the semiconductor substrate in the processing chamber. The method provides an inert gas flow outside the processing chamber and over the access port. The inert gas flow is created by passing an inert gas through an inert gas flow stabilizer positioned above the access port. The inert gas flow stabilizer includes a horizontal flow section and a vertical flow section, with the horizontal flow section of the inert gas flow stabilizer overlying the vertical flow section of the inert gas flow stabilizer. The inert gas flow is received in an inert gas flow receiver that includes a vertical flow section overlying a horizontal flow section.

In another embodiment, the present disclosure describes a gas flow system that includes gas flow stabilizer, the gas flow stabilizer including a horizontal flow section and a vertical flow section. In accordance with this embodiment, the horizontal flow section of the gas flow stabilizer overlies the vertical flow section of the gas flow stabilizer. The horizontal flow section of the gas flow stabilizer includes a plurality of overlapping horizontal gas flow paths and the vertical flow section of the gas flow stabilizer includes a plurality of vertical gas flow paths. The system further includes a gas flow receiver including a vertical flow section and a horizontal flow section. The vertical flow section of the gas flow receiver overlies the horizontal flow section of the gas flow receiver. The vertical flow section of the gas flow receiver includes a plurality of vertical gas flow paths and the horizontal flow section of the gas flow receiver includes a plurality of overlapping horizontal gas flow paths.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A system, comprising:
a substrate staging module including a wall, the wall having an access port;
a gas flow stabilizer proximate to a first side of the access port, the gas flow stabilizer including a horizontal flow section and a vertical flow section, the horizontal flow section of the gas flow stabilizer overlying the vertical flow section of the gas flow stabilizer, the horizontal flow section of the gas flow stabilizer including a plurality of overlapping horizontal gas flow paths and the vertical flow section of the gas flow stabilizer including a plurality of vertical gas flow paths; and
a gas flow receiver proximate to a second side of the access port, the gas flow receiver including a vertical flow section and a horizontal flow section, the vertical flow section of the gas flow receiver overlying the horizontal flow section of the gas flow receiver, the vertical flow section of the gas flow receiver including a plurality of vertical gas flow paths, and the horizontal flow section of the gas flow receiver including a plurality of overlapping horizontal gas flow paths,
wherein each of the plurality of overlapping horizontal gas flow paths in the gas flow stabilizer is opposite in horizontal direction to a preceding horizontal gas flow path.

2. The system of claim 1, wherein the plurality of overlapping horizontal gas flow paths of the gas flow stabilizer are defined between a plurality of overlapping horizontal plates.

3. The system of claim 1, wherein the plurality of vertical gas flow paths of the gas flow stabilizer are defined between a plurality of vertical plates.

4. The system of claim 3, wherein at least two pairs of the plurality of vertical plates are spaced apart unequally.

5. The system of claim 1, wherein the plurality of vertical gas flow paths of the gas flow receiver are defined by a plurality of vertical conduits.

6. The system of claim 5, wherein the vertical conduits have a round cross-section.

7. The system of claim 1, further comprising a plurality of gas inlets coupled to the horizontal flow section of the gas flow stabilizer, the plurality of gas inlets being in fluid communication with the gas flow stabilizer.

8. The system of claim 1, further comprising a source of a vacuum in fluid communication with the gas flow receiver.

9. The system of claim 4, wherein plurality of vertical plates are spaced apart at least 2 mm.

10. The system of claim 1, wherein each of the plurality of overlapping horizontal gas flow paths in the gas flow receiver is opposite in horizontal direction to a preceding horizontal gas flow path.

11. The system of claim 1, wherein the gas flow receiver is equipped with vertical conduits having a round cross-section and a diameter of about 2 mm.

12. The system of claim 7, wherein the plurality of gas inlets are in fluid communication with a source of gas.

13. The system of claim 1, wherein the vertical flow section of the gas flow receiver is equipped with a plurality of conduits arranged in rows, each row including a plurality of vertical conduits, with the position of the vertical conduits of adjacent rows being offset from each other.

14. A system, comprising:
a substrate staging module including a wall with an access port;
a gas flow stabilizer included above the access port and coupled to a surface of the wall interior to the substrate staging module, the gas flow stabilizer including a horizontal flow section and a vertical flow section, the horizontal flow section of the gas flow stabilizer overlying the vertical flow section of the gas flow stabilizer, the horizontal flow section of the gas flow stabilizer including a plurality of horizontal gas flow paths and the vertical flow section of the gas flow stabilizer including a plurality of vertical gas flow paths, wherein the plurality of horizontal gas flow paths is serpentine; and
a gas flow receiver included below the access port and coupled to the surface of the wall interior to the substrate staging module, the gas flow receiver including a vertical flow section and a horizontal flow section, the vertical flow section of the gas flow receiver overlying the horizontal flow section of the gas flow receiver, the vertical flow section of the gas flow receiver including a plurality of vertical gas flow paths, and the horizontal flow section of the gas flow receiver including a plurality of horizontal gas flow paths.

15. The system of claim 14, wherein the plurality of horizontal gas flow paths of the gas flow stabilizer are defined between a plurality of horizontal plates.

16. The system of claim 14, wherein the plurality of vertical gas flow paths of the gas flow stabilizer are defined between a plurality of vertical plates.

17. The system of claim 14, wherein the plurality of vertical gas flow paths of the gas flow receiver are defined by a plurality of vertical conduits that have a round cross-section.

18. A system, comprising:
a substrate staging module including a wall, the wall having an access port;
a gas flow stabilizer proximate to a first side of the access port and coupled to the wall, the gas flow stabilizer including a horizontal flow section and a vertical flow section, the horizontal flow section of the gas flow stabilizer overlying the vertical flow section of the gas flow stabilizer, the horizontal flow section of the gas flow stabilizer including a plurality of overlapping horizontal gas flow paths and the vertical flow section of the gas flow stabilizer including a plurality of vertical gas flow paths, wherein the plurality of overlapping horizontal gas flow paths of the gas flow stabilizer are defined between a plurality of overlapping horizontal plates, and the plurality of vertical gas flow paths of the gas flow stabilizer are defined between a plurality of vertical plates; and a gas flow receiver proximate to a second side of the access port and coupled to the wall, the gas flow receiver including a vertical flow section and a horizontal flow section, the vertical flow section of the gas flow receiver overlying the horizontal flow section of the gas flow receiver, the vertical flow section of the gas flow receiver including a plurality of vertical gas flow paths, and the horizontal flow section of the gas flow receiver including a plurality of overlapping horizontal gas flow paths.

19. The system of claim 18, wherein at least two pairs of the plurality of vertical plates are spaced apart unequally.

20. The system of claim 18, wherein the plurality of vertical gas flow paths of the gas flow receiver are defined by a plurality of vertical conduits.

* * * * *